United States Patent [19]

Saulnier

[11] Patent Number: 4,459,590
[45] Date of Patent: Jul. 10, 1984

[54] PASSIVE PROGRAMMABLE TRANSDUCTOR FOR DYNAMIC CODING

[76] Inventor: Dominique C. Saulnier, 37-39 Allee du Closeau, 93160 Noisy Le Grand, France

[21] Appl. No.: 324,960

[22] Filed: Nov. 25, 1981

[30] Foreign Application Priority Data

Nov. 26, 1980 [FR] France .................. 80 25035

[51] Int. Cl.³ .................. H04Q 9/00; G06K 7/01
[52] U.S. Cl. .................. 340/825.54; 365/192
[58] Field of Search .................. 340/825.54, 825.57, 340/825.72; 365/192, 222; 235/449, 488, 438; 343/6.8 R, 6.5 SS, 6.5 LC

[56] References Cited

U.S. PATENT DOCUMENTS 3,448,440 6/1969 Wiegand .................. 343/6.8 R
3,641,316 2/1972 Dethloff .................. 340/825.34
4,223,830 9/1980 Walton .................. 235/488
4,270,187 5/1981 Buttemer .................. 365/192

FOREIGN PATENT DOCUMENTS 2082816 3/1982 United Kingdom .................. 235/449

Primary Examiner—Donald J. Yusko
Attorney, Agent, or Firm—Cushman, Darby & Cushman

[57] ABSTRACT

A device for recording a variable information in a programmable hub, for storing it and for restoring it without contact or electrical connection and without electric supply between the hub and information generator or the information readers. The generator or the readers comprise an oscillator or a power coil which supply the programmable hub with energy. The programmable hub restores the information by actuating an active loop which operates on a signal oscillator or on the readers. The invention is particularly applicable to dynamic coding.

11 Claims, 10 Drawing Figures

PASSIVE PROGRAMMABLE TRANSDUCTOR FOR DYNAMIC CODING

BACKGROUND OF THE INVENTION

The device forming the subject of the invention is for recording, storing and restoring, without contact or electrical connection and without out an electric supply, variable information which another device has communicated thereto without contact or electrical connection.

The function performed by this device is called "dynamic coding".

At the present time, dynamic coding is achieved in two ways:

(a) With magnetic-doublet based devices which, depending on their magnetic polarity, modify the frequency of an oscillator into $\pm\Delta f$, the interpretation of the direction of $\Delta f$ being associated with a bit 1 or 0. The disadvantages of magnetic-doublet systems are that the information is transmitted in parallel form and therefore the size of the system is a function of the extent of this information, that the coding syptem is expensive and complicated and that the material forming the magnetic doublets is very special and the supply of which is delicate.

(b) With a battery of frequency emitters which act on a battery of frequency receivers: the information received actuates bistable relays which bring into operation or not frequency emitters different from the preceding ones and which restore their frequency to a battery of receivers themselves distinct from the preceding ones. The disadvantages of this system appear in the fact that the information is transmitted in parallel form and that the size of the system is linked to the extent of this information (this size is increased by the fact that the emitters interfere with each other and that they must then be spaced apart), in the fact that memorization is achieved by means of bistable relays which may offer contact hazards in cases of vibration and in the fact that it requires the use of a large number of means, much wiring and so impaired reliability.

SUMMARY OF THE INVENTION

The device forming the subject of the invention is controlled by a system, for example based on a microprocessor, which supplies thereto the information to be stored and which is capable of conversing therewith, and this device of the invention comprises: a passive programmable hub, one or more reading hubs, a programming sequencer, as well as a means which allows the programming sequencer to write (without contact or electrical connection) variable information in the programmable hub, a means which allows the programmable hub to collect this information, a means which allows the programmable hub to store this information, a means which allows the programmable hub to keep this information for several years in the absence of electric energy, a means which allows the programmable hub to restore this stored information to the programming sequencer or to the reading hubs, a means which allows the programming sequencer or the reading hub to collect (without contact or electrical connection) this information, a means which allows the programming sequencer to check if the stored information is identical to the information to be stored, a means which allows the reading hub to restore the information at parallel outputs.

The sequencer receives at its inputs the information to be stored in the programmable hub. An input allows this information to be written, without contact or electrical connection, in this programmable hub. For this, the programming sequencer converts into serial form the parallel information by including therein timing and parity bits and by modulating the width of these bits.

The programmable hub receives this information, synchronizes itself and checks the validity of the transmission. The correct information received is set in parallel form and an enabling signal allows this information to be transferred to a memory whose cells are enabled. The output signals of the memory are set in serial form. The programmable hub includes timing (special bit combination) and parity information. The information thus structured is returned from the programmable hub to the programming sequencer (without contact or electrical connection) by actuating a static switch which closes or opens an active loop formed by a spiral etched on a printed circuit and a capacitor.

The programming sequencer analyses and tests this information, then restores it in parallel form. The parallel information to be programmed is compared with the parallel information received in the programming sequencer. If there is equality, the programming sequencer delivers a signal which indicates that the programmable hub has recorded correct information, if not a "programming defect" output is actuated. In the case of reading by a reading hub, the programmable hub brings the static switch into operation which closes or not an active loop, formed by a spiral etched on a printed circuit and a capacitor, at the timing of the information recorded by the programmable hub. This information recorded by the programmable hub is set in serial form and the programmable hub inserts timing and parity information.

The reading hub synchronizes itself to this information and tests the parity, then this information is transferred in parallel form to the output interfaces of the reading hub. For this, the programming sequencer (function: reading) and the reader dispose of a power oscillator connected to an emission coil concentric with the signal coil associated with a signal oscillator. The frequencies of the power modulator and of the signal oscillator are different and the two oscillators are in operation at the same time. Moreover, the programming sequencer disposes of a programming coil coplanar with the power and signal coils. With this coil is associated a programming oscillator which is operated at the timing of the series signal, a transform of the parallel information to be stored in the programmable hub.

The programmable hub comprises a reception coil tuned to the frequency of the power oscillator, a reception coil tuned to the frequency of the programming oscillator, a series resonance circuit formed of a static switch, a spiral etched on a printed circuit and a tuning capacitor. This series resonance circuit is tuned to the frequency of the signal oscillator. When a reading hub is opposite the programmable hub, the coil tuned to the frequency of the power oscillator is the seat of an induced electromotive force of high value. This electromotive force is rectified, smoothed and delivers a DC supply voltage to the programmable hub. The information present in the storage means of the programmable hub in parallel form is set in series form by a converter, this series information transits in an emission modulator whose function is to include in the series message timing information, to calculate and include a parity bit, to distinguish a "1" bit from a "0" bit for example by modulating the width of the basic elementary signal. The output of the modulator drives, through a level adaptor, a static switch. This static switch closes or opens, at the timing of the output signal of the modulator, a series resonating circuit tuned to the frequency of the signal oscillator of the reading hub. When the static switch is closed, the series resonating circuit is formed. Thus, the programmable hub takes energy, by eddy currents, from the signal oscillator. When the static switch is open, the series resonating circuit is not formed and thus the programmable hub does not take energy from the reading hub. Thereby, depending on the signal from the output of the modulator of the programmable hub, the programmable hub takes or does not take energy from the reading hub. This energy modification is treated so as to provide an all-or-nothing signal, the image of the all-or-nothing signal from the modulator of the programmable hub, itself being the translation of the information stored in the memory of the programmable hub. The all-or-nothing signal elaborated in the reading hub is diverted to a demodulator whose function is to recognize the timing information and to elaborate, as soon as this recognition is accomplished, the procedure for recognizing the information by translating, into a succession of level "1" or "0" all-or-nothing signals, signals modulated, for example in width, by testing the parity and by elaborating therefrom an enabling signal or not depending on whether it is a question of information without or with transmission defect. The succession of all-or-nothing signals from the demodulator of the reading hub is directed to a converter which converts this series signal into parallel signals. These parallel signals are fed to the inputs of a temporary memory. Storing is provided or not by the presence or not of the enabling signal elaborated by the demodulator. The output of the memory cells actuates the output interfaces of the reading hub so as to reconstitute the information residing in the programmable hub. Furthermore, an additional input allows the high-impedance parallel outputs to be placed under the control of said system.

The programming sequencer has three distinct functions which may come into play simultaneously. Namely: a function of reading the programmable hub, a function of programming the programmable hub and a function of comparing the programmed information with the information to be programmed. The reading function is identical to that of the reading hub, insofar as the reader of the sequencer disposes of a power oscillator which supplies energy to the programmable hub, and also insofar as the signal oscillator is subjected to the influence of the series resonating circuit of the programmable hub. With all other functions remaining identical in other respects, the difference comes from the fact that the output cells of the temporary memory are connected to a group of inputs of a comparator, the other group of inputs being connected to the inputs of the sequencer which correspond to the information to be programmed in the programmable hub. If there is identity between the information to be programmed and the information stored by the programmable hub, the sequencer delivers a coincidence signal, otherwise the sequencer delivers a defect signal. The programming function consists in storing in the programmable hub the information present on the input lines of the programming sequencer, the procedure takes place as follows: the programming sequencer translates, in the form of a series signal, the information present at its parallel inputs, this series signal transits through a modulator identical to that of the programmable hub. The signal from the modulator enables or not the output of the programming oscillator at the timing of the series signal from the parallel information to be programmed, the programming oscillator and its associated coil create a field at the timing of the series information from the modulator of the programming sequencer, the coil receiving the programming signal is the seat of an electromotive force induced at a timing of the signal from the modulator of the programming sequencer, this electromotive force is rectified and smoothed so as to provide a series signal, the demodulator of the programmable hub analyses this signal, detects the timing information, the parity and transforms the signals, modulated for example in width, into a succession of all-or-nothing signals; if the information received is correct, the modulator delivers an enabling signal. The succession of all-or-nothing signals transits through a converter which translates these series signals into parallel signals. These parallel signals are present at the input of the memory and the storage control is enabled by the enabling signal from the demodulator of the programmable hub. It should be noted that energy is supplied to the programmable hub during these operations by the reading part of the programming sequencer or by the reading hub in a permanent way when they are opposite each other. When the programmable hub is neither opposite a programming sequencer nor opposite a reading hub, it does not receive the power signal and thus the electronics and in particular the memory of the programmable hub is not supplied from a DC voltage source. In this case, the information contained in the memory may be safeguarded by a battery connected solely to the power supply of the memory, the voltage developed by this battery playing no part in the functions of reading (by the reading hubs) or programming by the programming sequencers. Another method for safeguarding the stored information, in the absence of a reading hub or a programming sequencer, consists in using memories of the EAROM type whose function consists in retaining information in the absence of voltage at the power supply terminal.

The information to be stored may be in the form of one or more 8 or 16-bit words. In the case where the safeguard of the memory is formed by an EAROM memory, there may be several 8 or 16-bit words. These two safeguard variations (battery or EAROM) form part of the present invention. Since, for the programmable hub as for the programming sequencer, the "modulator" and "demodulator" functions are separate, the programming and the control may be carried out simultaneously, which allows possible programming during the movement of the programmable hub.

The programmable hub is in the form of a metal case with the electronics entirely molded in a resin.

The programming sequencer and the reading hub comprise two connectors, one for the information, the other for the voltage source.

Each item is comprised of a metal case with the electronics entirely molded in a resin.

BRIEF DESCRIPTION OF THE DRAWINGS

The present invention will be better understood from the detailed description of several embodiments given by way of nonlimiting examples and illustrated by the accompanying drawings, in which.

DESCRIPTION OF THE PREFERRED EMBODIMENTS

Figure 1:
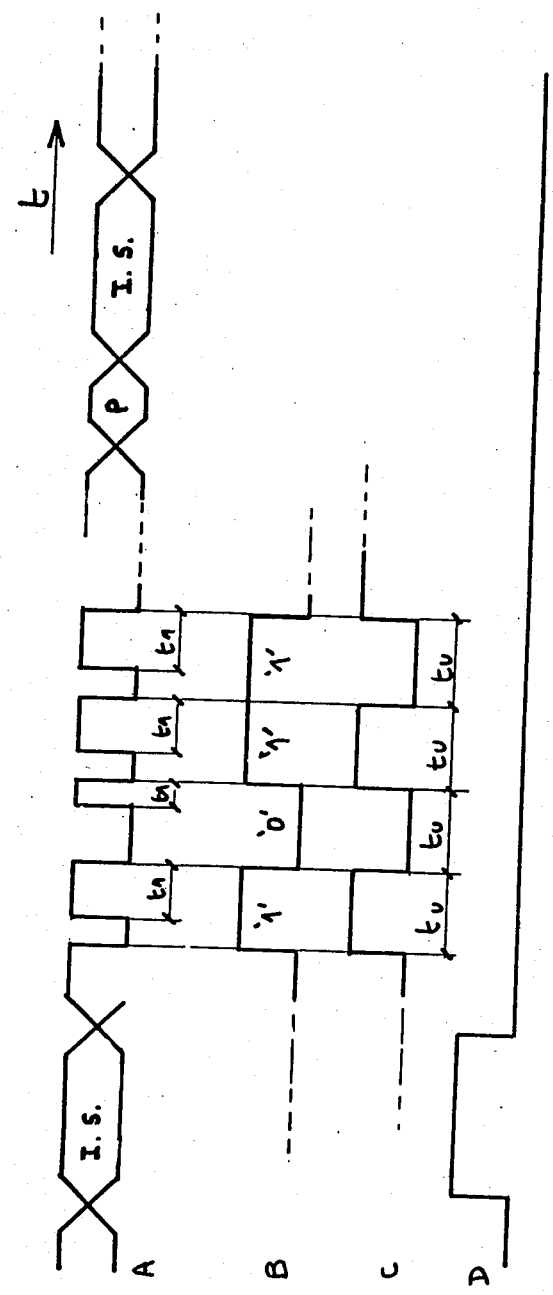
FIG. 1 is a timing diagram of different signals appearing in the device of the invention.

In the timing diagram of FIG. 1, there are respectively shown at lines A, B, C and D: the signal from the modulator, the series signal emitted or received, the clock signal and the enabling signal of the demodulator. In this FIG. 1, "I.S." signifies "timing information", i.e. a special bit combination which cannot be confused with any other information, and "P" signifies "parity bit" which is "0" or "1" depending on whether the total number of bits in a complete piece of information is even or uneven for example.

The information to be received or transmitted is set in series form (see B FIG. 1). A "1" bit corresponds to a positive voltage level, a "0" bit to a zero voltage level. The function of the modulator consists, within an elementary time (tu) (see signal C in FIG. 1), in modifying the cyclic relationship between a positive voltage level and a zero voltage level. If t1 is the duration, within the unit time interval tu, of the positive voltage level, there will be a "1" information bit when: $0.55\ tu < t1/tu < tu$, there will be a "0" bit when: $0 < t1/tu < 0.45\ tu$. The modulator modulates then in width, within a unit time element tu, which is the half-period of the clock signal, the duration t1 of the positive voltage level (see A FIG. 1). For a given piece of information, the number of "1" or "0" bits may be even or uneven. In fact, if n is the number of "1" bits, if $n/2 = k$ (k=whole number), the parity is even, the parity bit (P) will be a "1" bit if not it will be a "0" bit. The demodulator, as far as it is concerned, will have to recognize a transmission begin information so as to restore the bit with correct level and rank in the series information. For this, the modulator begins the transmission by means of timing information which consists of a particular and specific combination of "1" and "0" bits. This timing information may only be recognized by the demodulator. In the continuation of the transmission, comes the parity whose value will be stored in the memory of the demodulator, then the succession of "1" and "0" bits in which the analysis of t1/tu gives rise to a positive or zero voltage signal which is the restored series signal. The demodulator counts the number of elementary times tu and, at the end of the value N which corresponds to the number of bits to be transmitted, calculates the parity of the information received and compares it with the parity signal stored by the demodulator previously. If there is equality between the two parity values (received and calculated) the demodulator generates an enabling signal (D in FIG. 1) whose duration is equal to the transmission duration of the timing information which precedes the following information to be transmitted.

Figure 2:
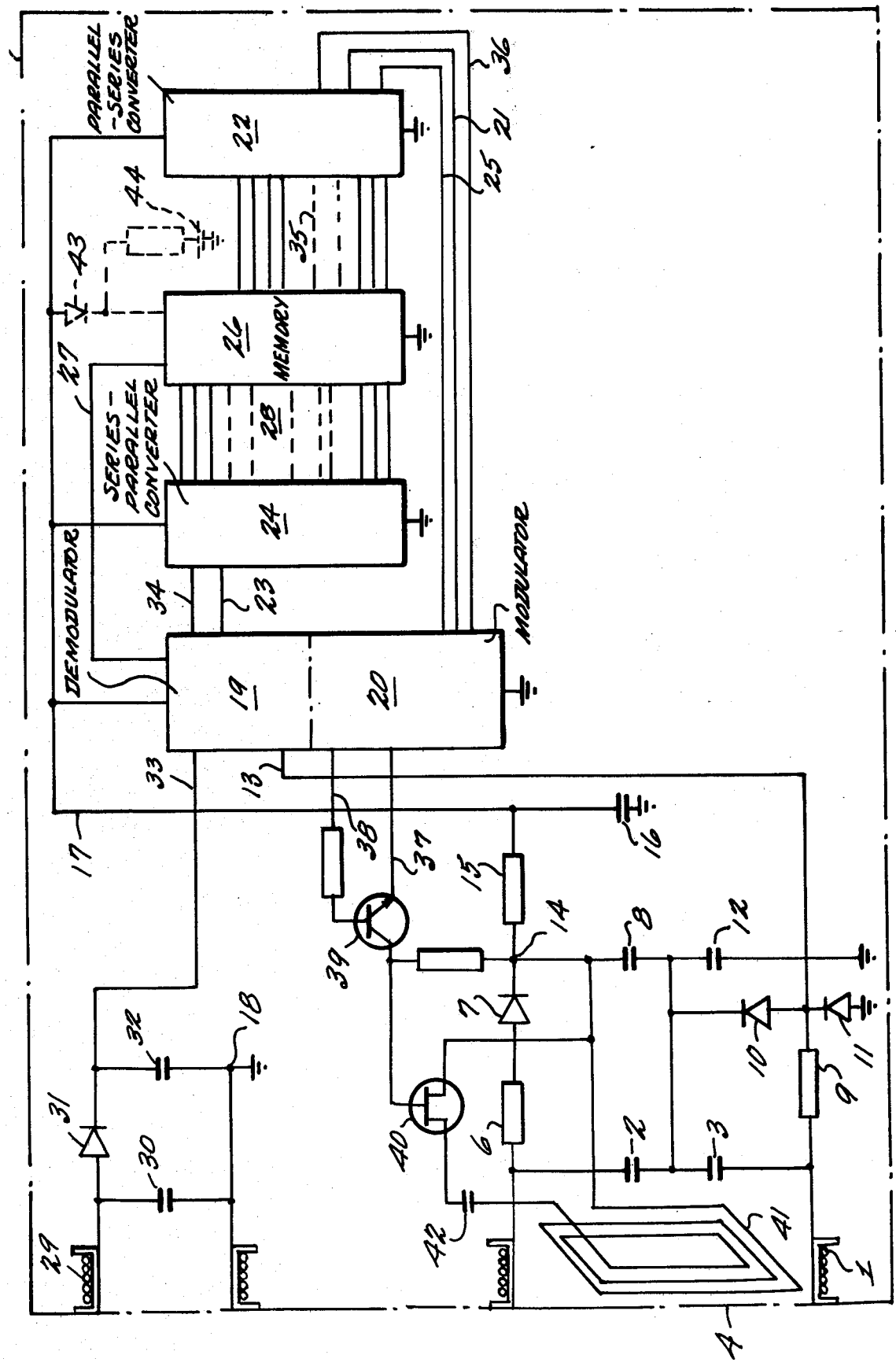
FIG. 2 is a diagram of a programmable hub of the device of the invention.

In FIG. 2, which is a diagram of the programmable hub, the broken lines correspond to the use of a memory 26 whose stored value is safeguarded by a battery 44 in the absence of a supply voltage 17, otherwise the memory 26 is of the EAROM type. The reception coil 1 comprises two windings, each tuned to the frequency of the power oscillator 58 or 101 by means of capacitors 2 and 3. This coil 1 is orientated towards the transmission face 4 of the programmable hub 5. The resistor 6, diode 7 and capacitor 8 network allows a positive voltage to be obtained at point 14. The resistor 15 and the capacitor 16 network enables the positive smoothed general supply voltage to be obtained at point 17. The resistor 9, diodes 10 and 11 and capacitor 12 network delivers a negative voltage at 18 which will be subsequently the voltage bus. The power signal provides for the basic clock frequency supplied to modulator 20 and demodulator 19, at 13 after clipping by means of diode 11. The demodulator 19 supplies the clock 23 to the series-parallel converter 24, modulator 20 supplies the clock to the parallel-series converter 22. Mbdulator 20 also supplies the reading signal 25 to memory 26. The demodulator 19 supplies the enabling signal 27 which allows writing of the parallel information present on lines 28 of the converter 24. According to a preferred embodiment the integrated circuit HD6409 is used comprising both the modulator and the demodulator, this circuit being also used in the sequencer and the reading hub described below. The coil 29 receiving the programming signal is tuned by capacitor 30 to the programming frequency. Diode 31 and capacitor 32 enable the information to be stored to be obtained in series form over line 33. Demodulator 19 receives on its line 33 the infommation to be stored, synchronizes itself to the timing information, tests the information and its parity and generates the enabling signal 27. Demodulator 19 creates a succession of "1" and "0" signals at its decoding output 34. This signal is converted by converter 24, which translates the series signal 34 into information in parallel form at its outputs 28. This parallel information is present on the input lines of memory 26. The enabling signal 27 allows this information to be transferred into the memory cells of memory 26. When the user or the control system wishes to read the data stored in memory 26, the programming sequencer or the reading hub transmits to the programmable hub a power signal which supplies with energy this programmable hub and feeds thereto a clock signal, and the modulator 20 generates on its line 25 a read-request signal to memory 26 and to converter 22. As soon as this signal is received on line 25, memory 26 delivers, over its output lines 35, the parallel information contained in this memory 26. This parallel information is present on lines 35 of converter 22 which puts them in series form at the timing of clock 21 and when the read-request signal 25 is active. The series signal transits over line 36 to the modulator 20—which includes the timing information, the parity and the width module of this signal 36. The modulator 20 has two outputs in phase opposition 37 and 38. Output 37 is connected to the emitter of a NPN transistor 39, the base of this transistor is connected, through a resistor, to the output 38. Depending on the polarity of the signals 37 and 38, transistor 39 is either heavily disabled or saturated. The collector of transistor 39 is connected to the static switch 40 formed for example from a field-effect transistor or from a V-MOS transistor. When transistor 39 is disabled, the static switch 40 is conducting and therefore presents a low passing resistance. When transistor 39 is saturated, the static switch 40 is open. When the static switch 40 is closed, it brings into operation a series resonating circuit formed of a spiral etched on a printed circuit 41 and a tuning capacitor 42. The tuning frequency corresponds to the frequency of the single oscillator 95 of the programming sequencer 74 or 51 of the reading hub 45. Energy is then received through coil 1, when a programming sequencer 74 or a reading hub 45 is opposite the programmable hub 5, for this coil receives the power signal emitted by these devices. When the programmable hub no longer receives this power signal, the information stored in the cells of memory 26 must be maintained. For this purpose, two possible techniques forming the subject matter of the invention are used: when the reading signal 25 is at 0, the outputs 35 of memory 26 are set at a high impedance. One safeguard method consists in using memories of the EAROM type, for example those manufactured by the company Xicor, whose technological construction, based on MOS technology (Metal Oxide Silicon), resolves this problem. Another safeguard method consists in using a battery 44 which is decoupled from the circuitry by diode 43 in the absence of the power signal. Since the outputs 35 of memory 26 are at a high impedance, the holding current is of the order of $10^{-12}$A, which allows a holding time for the information of the order of ten years.

Figure 3:
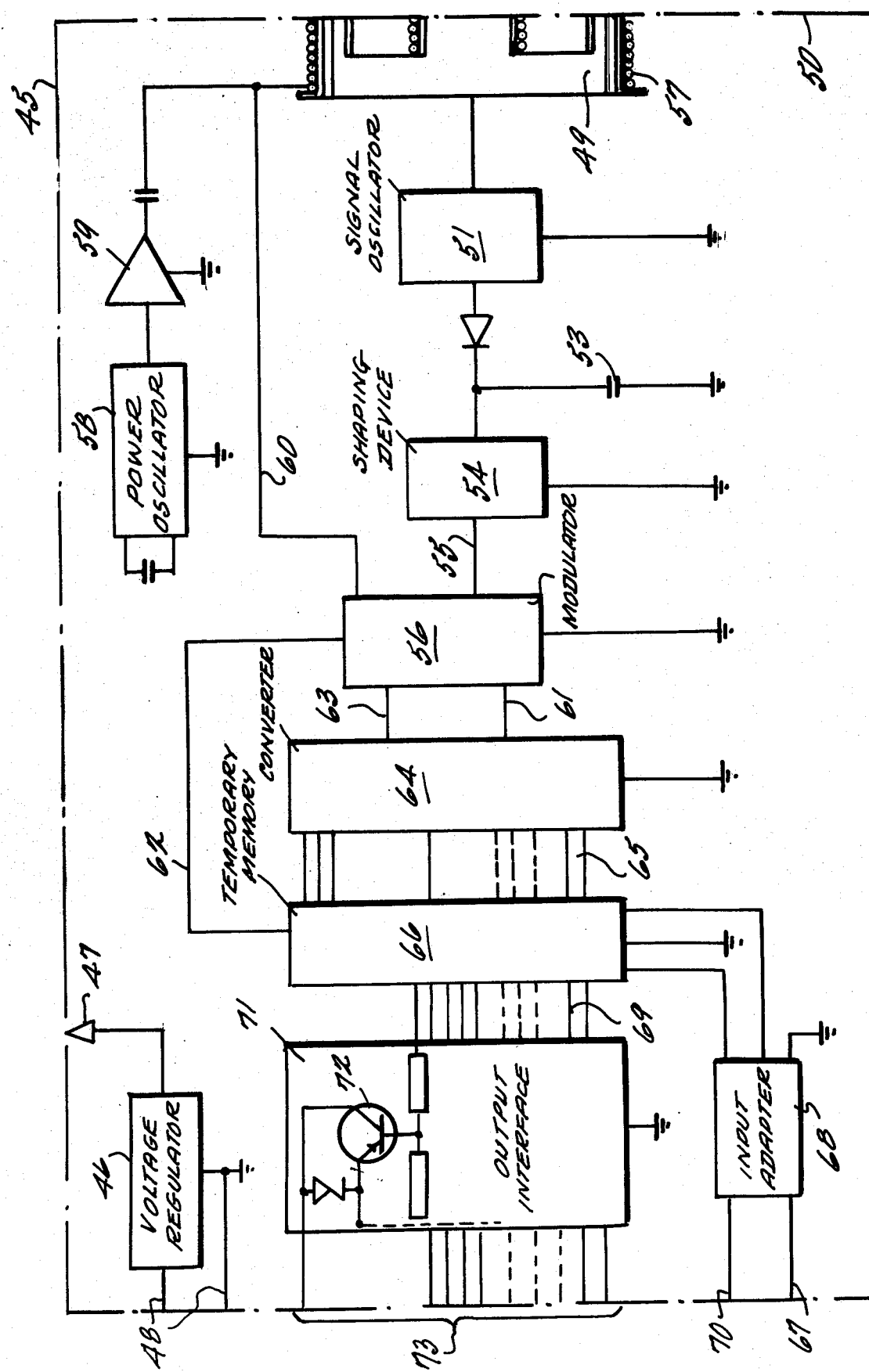
FIG. 3 is a diagram of the reading hub of the device of the invention.

The reading hub 45, the diagram of which is shown in FIG. 3, comprises a voltage regulator 46 which supplies the general power supply 47 to the electronic circuits from an external supply (not shown) connected to the terminals 48. A signal coil 49 emits in the vicinity of transmission face 50 an electromagnetic field whose frequency corresponds to the frequency of the signal oscillator 51. The signal from signal oscillator 51 is detected by diode 52 and capacitor 53. The signal obtained at 55 drives a shaping device 54, which is advantageously a Schmitt trigger and whose output is connected to the demodulator 56. A power coil 57, concentric with the signal coil 49, emits in the vicinity of the transmission face 50 an electromagnetic field whose frequency corresponds to the frequency of the signal of the power oscillator 58, which signal is amplified by the power amplifier 59. The frequency of the power signal forms the clock frequency 60 for the demodulator 56 of the reading hub 45 and is the same as the clock frequency 13 for modulator 20, for the demodulator 19 and for the programmable hub 5. This allows complete synchronism between the programmable hub 5 and the reading hub 45. From the clock frequency 60, the demodulator 56 generates by division, for example in the ratio of 1/12, another clock signal 61 and it further generates an enabling signal 62. The demodulator 56 analyses the timing, parity and cyclic ratio information of signal 55 and restores a binary series signal 63 formed from a succession of "1" and "0" signals. This signal 63 drives a converter 64 controlled by clock 61 which supplies the information in parallel form 65. This information 65 is conveyed to the temporary memory 66, which is advantageously a D-type flip-flop register, and the cells of which are enabled by the enabling signal 62. An external signal 67, produced by said system, and which transits through the input adapter 68, allows the output 69 of memory 66 to be placed at a high impedance, adaptor 68 comprising in a way known per se a resistor/capacitor filter and a Zener diode, for example, for shaping the signals arriving at 67 and 70. An external signal 70 which transits through the adaptor 68 allows the temporary memory 66 to be cleared. When signal 67 is not active, the outputs 69 of memory 66 actuate the output interface 71 formed for each output from transistorized amplifier circuits 72. When the programmable hub 5 is opposite the reading hub 45, the power emission coil 57 permanently emits the power signal to the power reception coil 1. The circuits of the programmable hub 5 are therefore supplied at a DC voltage appearing between point 18 and points 14 and 17. This results in bringing into operation, at the timing of the frequency of the power signal 13, modulator 20 which feeds over its line 25 a read request. In this case, memory 26 places on its output line 35 the information which it has stored. This information in parallel form 35 is put into series form 36 by converter 22. The series signal delivered at the output 36 transits through the modulator 20 which includes timing and parity information and translates the "1" and "0" signals of information 36 into width-modulated signals, which appear at the outputs 37 and 38. Thus, through transistors 39 and 40, the series resonating circuit 41, 42, 40, tuned to the signal frequency of the oscillator 51 of the reading hub 45, is or is not brought into operation. When the static switch 40 is closed, the signal electromagnetic field emitted in the vicinity of transmission face 50 by coil 49 is absorbed, by eddy currents, by the series resonating circuit 40, 41, 42. This reduces the oscillation level of the signal oscillator 51 which, after detection by the network 52, 53 and shaping by the circuit 54, allows a "1" Voltage level to be obtained on line 55. When the static switch 40 is open, the series resonating circuit is no longer formed and the signal electromagnetic field is no longer absorbed, which by the above procedure allows a "0" voltage level to be obtained on line 55. Thus, on line 55, the succession of "1s" and "0s" is the image of the image of the succession of "1s" and "0s" from lines 37 and 38 of the modulator 20 of the programmable hub 5. Then, the demodulator 56, the converter 64, the temporary memory 66, the output interface 71 restore on the output lines 73 the information stored in memory 26 and restored by the programmable hub 5. The exchange of information between the programmable hub 5 and the reading hub 45 is permanent as long as these two hubs are opposite one another. If not, the last correct information received by the reading hub 45 remains in the temporary memory 66, when the two are no longer opposite each other. Then, the signal applied at 70 allows the contents of this memory to be cleared.

Figure 4:
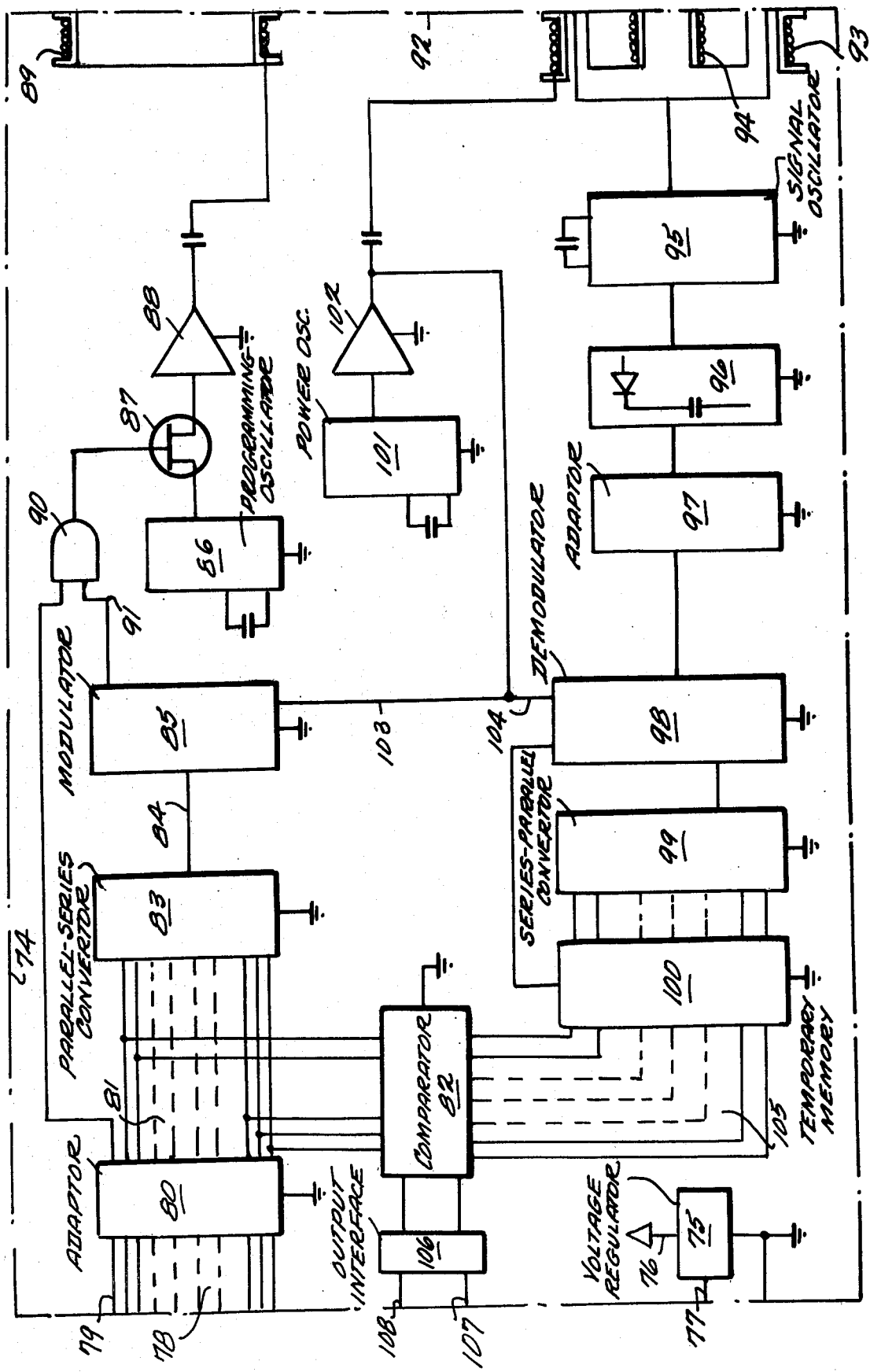
FIG. 4 is a diagram of the sequencer of the device of the invention.

The programming sequencer 74, the diagram of which is shown in FIG. 4, comprises a voltage regulator device 75 which, from the general power supply voltage arriving at 77, supplies the power 76 to the whole of the electronic circuits. The parallel input lines 78 receive the information to be programmed and the request for programming the system 79; the control (not shown) cooperating with the device of the invention. These lines transit through an adaptor 80 similar to adaptor 68. The outputs 81 of this adaptor drive simultaneously the inputs of a comparator 82 and the inputs of a parallel-series converter 83. The output 84 of converter 83 is connected to the input of a modulator 85 whose function consists in including timing and parity information and in modulating in width the signals coming from converter 83. A programming oscillator 86 oscillates permanently at the programming frequency. The power amplifier 88 receives this frequency, at the timing of the output signal 91 of modulator 85, through the static switch 87 when it is enabled by the action of signal 79 at gate 90. The output of amplifier 88 supplies the programming coil 89, which emits at the timing of signal 91 an electromagnetic field at the programming frequency, opposite the transmission face 92. The reading part of the programming hub formed by the power coil 93, signal coil 94, the signal oscillator 95, the detection cell 96, the adaptor 97 which is advantageously a Schmitt trigger, the demodulator 98, the series-parallel converter 99, the temporary memory 100 which is also a D flip-flop register, the power oscillator 101, the power amplifier 102 plays the same role as the corresponding part of reading hub 45. It should be noted that the clock frequency 103 of the modulator 85 is the same as that 104 of the demodulator 98, which is the same as the clock frequency 13 of the modulator 20 and of the demodulator 19 of the programmable hub 5, since it is the frequency of the power oscillator 101 of the programming sequencer 74. In this case, the programming sequencer 74 is perfectly synchronous with the programmable hub 5. The emission of the information to be stored and the reception of the programmed information is simultaneous. In fact, the modulator and the demodulator of each of the hubs 5 and 74 act independently of each other. So as to modify the information written in memory 26 of the programmable hub 5, its electronic circuitry must be supplied with power which presupposes that this hub receives the power signal, receives the programming frequency, receives correctly formated information, that the clock frequencies are identical. All these conditions form a key which makes modification of the code impossible by any other element than the programming sequencer The information received over lines 105 of the temporary memory 100 is switched to the other inputs of comparator 82. The comparison takes place bit by bit. If the information on lines 81 is identical to that on lines 105, comparator 82 generates a signal 107 which transits through the output interface 106, similar to interface 71. Otherwise, the defect output 108 is active, the outputs 107 and 108 being connected to said control system.

Figure 5:
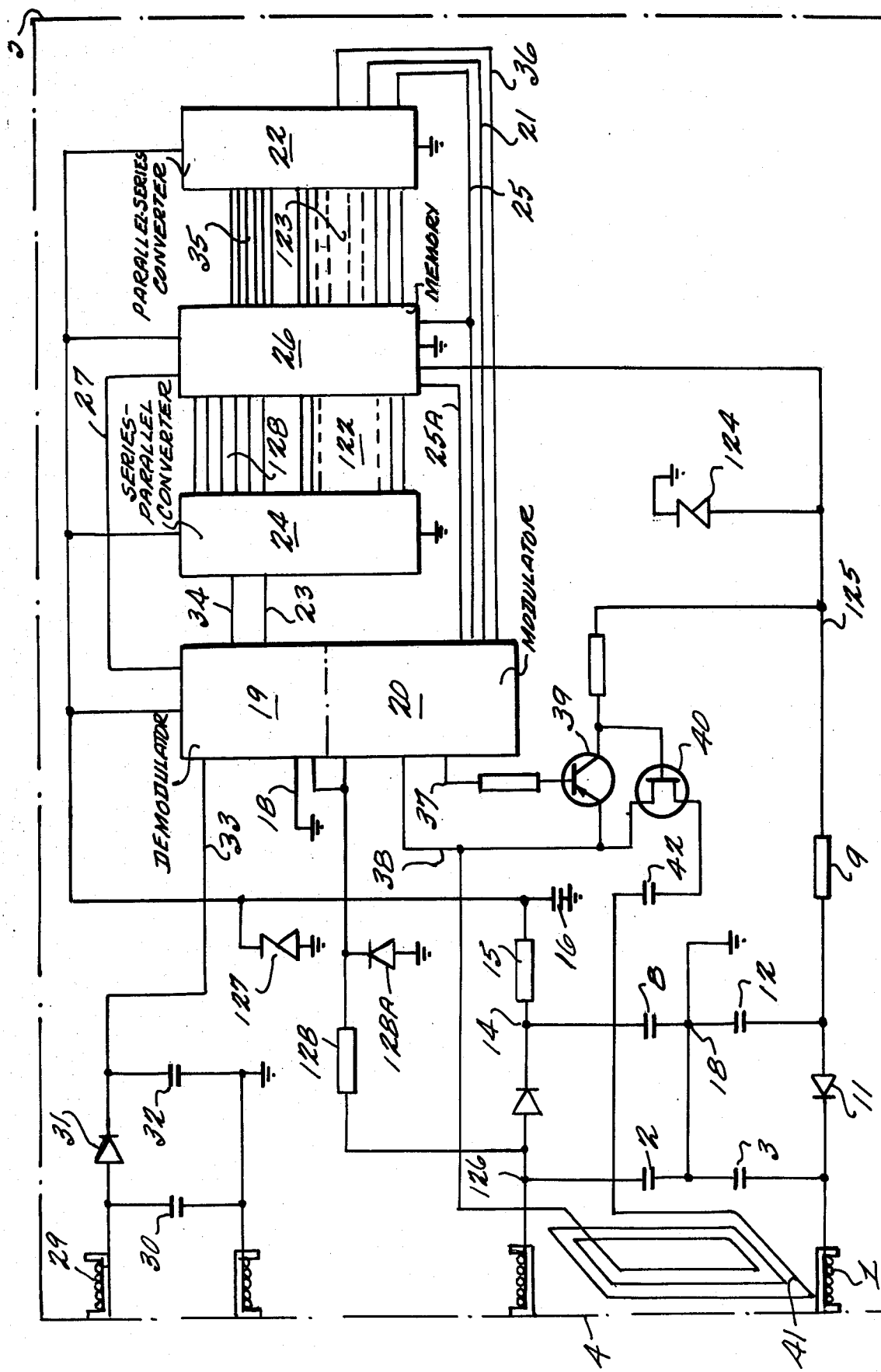
FIG. 5 is the diagram of a variation of the programmable hub of FIG. 2.

There is shown in FIG. 5 the diagram of another embodiment of the programmable hub—elements identical to those of the above-described embodiment and shown in FIG. 2 bear the same reference numbers. The embodiment of FIG. 5 is essentially that comprising an EAROM-type memory 26.

In this programmable hub, coil 1 for receiving the power signal comprises two windings each tuned to the frequency of the power oscillator 135 of the reading hub (see FIG. 6) and of the power oscillator 101 of the programming sequencer (see FIG. 4) by means of capacitors 2 and 3 respectively. This coil 1 is orientated towards the transmission face 4 of the programmable hub 5. The diode 7 and capacitor 8 allow a positive rectified voltage to be obtained at point 14. This voltage is smoothed and stabilized by resistor 15, capacitor 16 and Zener diode 127 and is available at point 17. Diode 11 and capacitor 12 allow a negative rectified voltage to be obtained which is stabilized by resistor 16 and Zener diode 124. This stabilized voltage is available at point 125 and serves for supplying with power certain types of EAROM memories. If memories are used requiring only a positive supply voltage, point 125 becomes the common point of the voltages. In the case of positive and negative voltages, the common point is, as shown in FIG. 5, point 18 which is the common point of the windings of coil 1.

The power signal, tapped at point 126, is clipped by resistor 128 and diode 128A and is fed as clock signal to modulator 20 and demodulator 19. Demodulator 19 supplies on line 23 a clock signal to the series-parallel converter 24 and modulator 20 supplies a clock signal over line 21 to the parallel-series converter 22.

Coil 29 for receiving the programming frequency forms with capacitor 30 a resonating circuit tuned to the programming frequency. Diode 31 and capacitor 32 enable the information to be stored to be obtained by detection, which information is fed over line 33 to demodulator 19. Demodulator 19 synchronizes itself to the timing information (see FIG. 1, line A), tests the parity and generates an enabling signal over line 27. The output signals of the demodulator are fed by line 34 to converter 24. Converter 24 translates the information in parallel form and feeds it to memory 26. The data contained in the information is sent over lines 28 to memory 26 at addresses communicated by the addressing lines 122. If for example each piece of information is expressed in sixteen bits, the eight least significant bits relate to the datum and the eight most significant bits relate to the address of this datum.

When the user or the control system wishes to read the data stored in memory 26, he feeds through the reading hub (see above description of FIG. 6) or through the programming sequencer a read-request signal in addition to the address in memory 26 in which it is desired to read the data. The address is transmitted by demodulator 19 and converter 24 to memory 26, whereas the read-request signal is fed by the demodulator 19 to modulator 20 which emits over line 25 a read-request signal and over line 25A a read-selection signal which places the outputs of memory 26 at a low impedance. The data read from memory 26 at the address indicated are fed over lines 123 and their addresses over lines 35 to converter 22 which puts them in series and transfers them over line 36 to modulator 20 at the timing of the clock signal fed over line 21 by modulator 20. Modulator 20 includes in this information, timing information, a parity bit and modulates them. The output signal of modulator 20 appears at both its outputs 37 and 38 which are in phase opposition. Output 38 is connected to the emitter of a PNP transistor 39 whose base is connected through a resistor to output 37. Depending on the polarity of the signals at the outputs 37 and 38, transistor 39 is heavily saturated or disabled. When transistor 39 is disabled, the static switch 40 is conducting and so closed, and when 39 is saturated switch 40 is open.

When switch 40 is closed, it brings into operation a series resonating circuit formed from a spiral etched on a printed circuit 41 and a tuning capacitor 42. The tuning frequency of this circuit corresponds to the frequency of the signal oscillator 95 of the programming sequencer 74 or of the oscillator 157 of the reading hub 129.

The programmable hub permanently receives through its coil 1 the power signal which allows it to be supplied with power when a sequencer 74 or a reading hub 129 is opposite this programmable hub. When the programmable hub no longer receives this power signal it is no longer supplied with energy, but the information contained in the cells of memory 26 are safeguarded because of the fact that this memory is of the EAROM type or equivalent.

The reading hub 45 of FIG. 3 is only used in the case when a single word (a single piece of information) is to be stored in memory 26, whose address lines 122 are hard-wired so as to always use the same address.

Figure 6:
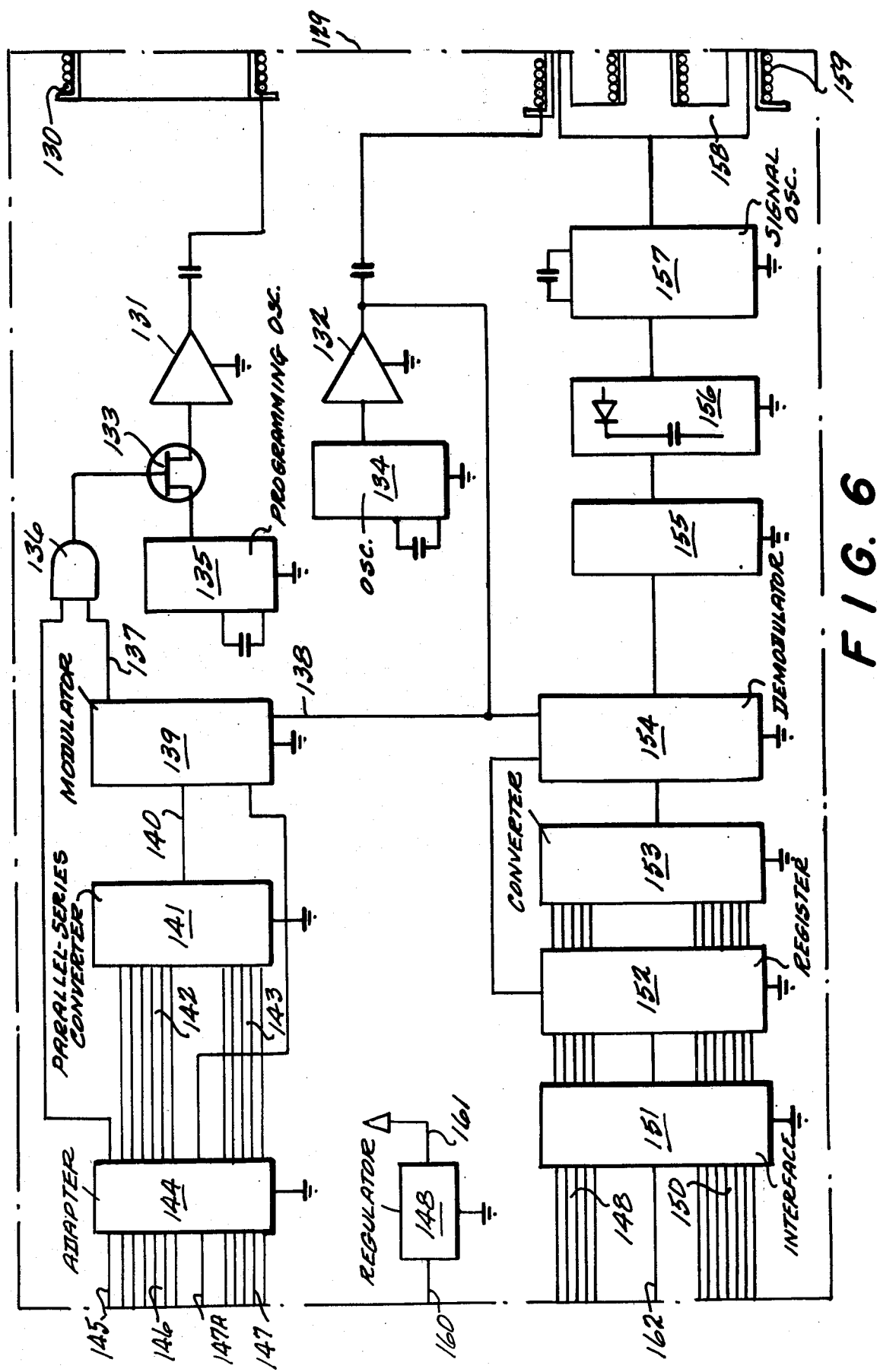
FIG. 6 is the diagram of a variation of the reading hub of FIG. 3.

If it is desired to store several words in memory 26, the circuit shown in FIG. 6 is used for the reading hub. The reading hub comprises a voltage regulator device 148 which is connected by a line 160 to a supply circuit (not shown). The output 161 of regulator 148 supplies, in a way not shown, the supply voltage to all the circuits of the reading hub.

The reading hub comprises in its programming part an input adapter (shaping circuit) 144, similar to circuit 80 of FIG. 4, and having several inputs connected to the control system. The inputs 146 receive the data to be stored, inputs 147 receive the address at which these data are to be stored, input 145 receives a programming enabling signal and input 147A receives a read-request signal.

Outputs 142 and 143 of adapter 144, corresponding respectively to its inputs 146 and 147, are connected to a parallel-series converter 141 whose output is connected to a modulator 139 identical to those described above. The output of adapter 144, corresponding to the input 147A, is connected to a modulator 139. The output of modulator 139 is connected to a first input of an AND gate 136 whose other input is connected to an output of adapter 144 corresponding to input 145. The output of gate 136 is connected to the control electrode of a circuit switch 133 which connects a programming oscillator 135, permanently oscillating, to a power amplifier 131 whose output is connected to a programming coil 130 which emits at the timing of the output signal of the modulator, when gate 136 is enabled by the input signal 145, an electromagnetic field at the programming frequency, in front of the transmission face 129 of the reading hub.

The reading part of the reading hub comprises a power coil 159 supplied with power by an oscillator 134 and a power amplifier 132, and a signal coil 158 connected to a signal oscillator 157. Oscillator 157 is connected to a detection cell 156 whose output is connected through a shaping circuit 155, advantageously a Schmitt trigger, to a demodulator 154. The output of demodulator 154 is connected by a series-parallel converter 153 and by a register 152 to an output interface 151 similar to interface 71 of FIG. 3. Interface 151 also comprises an input 162 for enabling its outputs 149 and 150. This reading part is similar to that of the reading hub 45 of FIG. 3.

It should be noted that the output of amplifier 132 is also connected to the clock signal inputs of modulator 139 and demodulator 154, and that the frequency of the signal of oscillator 134 is the same as that of the clock signal of modulator 20 and demodulator 19 of the programmable hub. The emission of the data to be programmed (inputs 146) at the desired addresses (inputs 147) may take place simultaneously with the reception of the programmed data (outputs 150 of interface 151) at the corresponding addresses (outputs 149), this under the control of the control system, because the modulator and the demodulator of the programmable hub and of the reading hub act independently of each other. Thus, it may be checked that at each address in question, what was desired has actually been stored.

Figure 7:
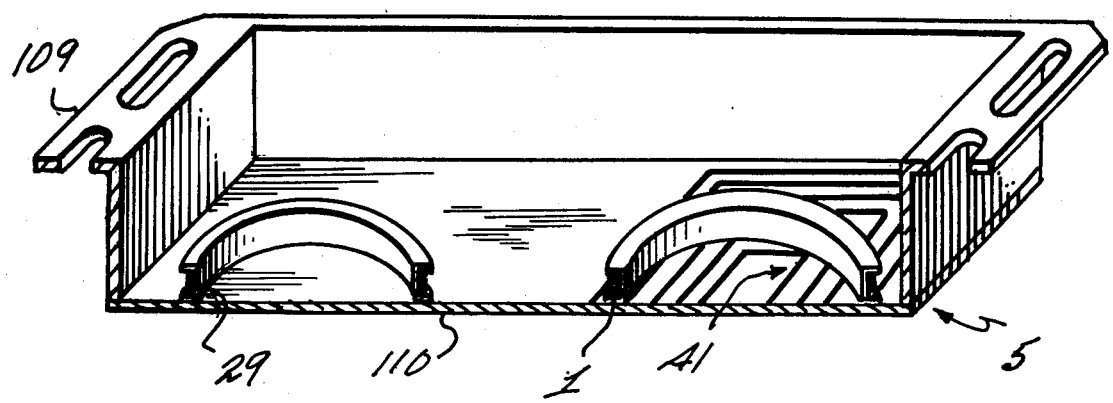
FIGS. 7 and 8 are partial perspective views in section of the programmable hub.
Figure 8:
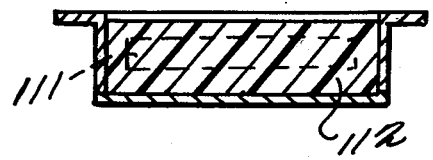

The programmable hub 5 (see FIGS. 7 and 8) comprises a metal case 109 to which is bonded a front face 110 on which the spiral 41 is etched. Power reception coil 1 is placed on spiral 41 whereas the coil 29 for receiving the programming signal is off-center. The electronic circuit 111 is molded in a resin 112, which makes the information contained in memory 26 physically inaccessible and which gives a character of inviolacy to the stored information. This hub 5 comprises no connector.

Figure 9:
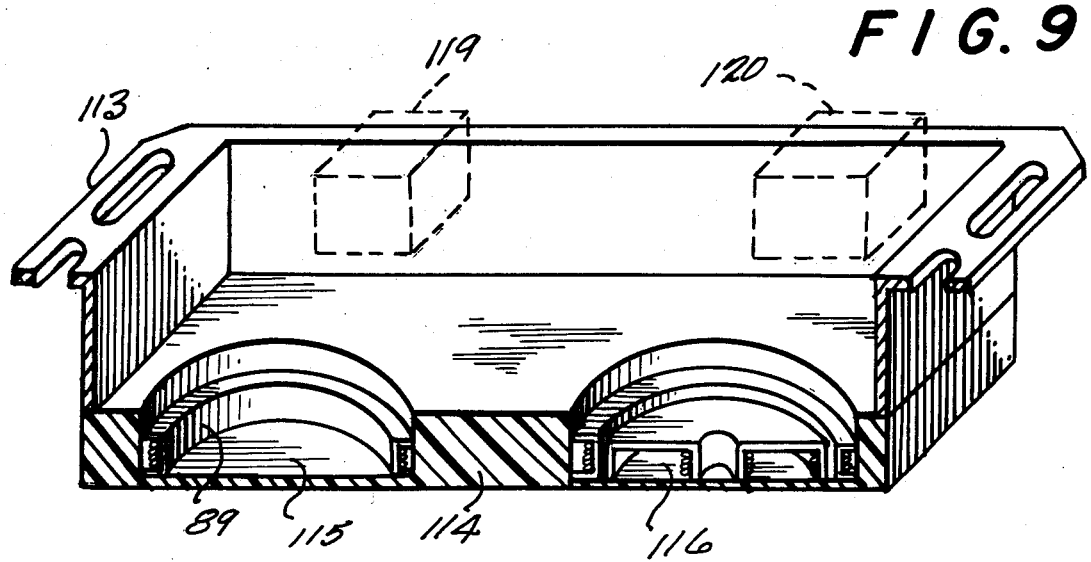
FIGS. 9 and 10 are partial perspective views in section of the programming sequencer.
Figure 10:
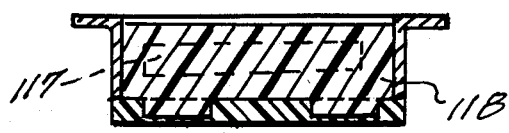

The programming sequencer 74 (see FIGS. 9 and 10) comprises a metal case 113 having a plastic material front face. This front face 114 contains two spot-faced holes 115 and 116. Inside 116 are placed the power emission coil 93 and the signal coil 94. In spot-faced hole 115 is located the coil 89 for emitting the programming frequency. The electronic circuit 117 is molded in a resin 118. Case 113 is equipped with two connectors 119 and 120.

The reading hub 45 is identical, in its presentation, with the programming sequencer 74 except that: there is no coil 89 for the programming signal, the spot-faced hole 115 is omitted. The length of the case is half that of the case of the programming sequencer 74.

The device of the invention may be used in dynamic coding applications for objects, steering, reference location. It may also be considered as a distributed integrating memory of an automatic device, but physically separate.

Its advantage is that the element is directly coded without having to effect a conversion between the element and a support code.

What is claimed is:

1. A system for storing information on and then retrieving the stored information from a movable information support by induction comprising:
 a fixed programming sequencer including
 means for receiving information from an external source to be stored on said movable support,
 power and clock genrating means for providing a power source and clock signal,
 power induction transmitting means, coupled to said power oscillator, for providing a power electromagnetic field for coupling power by induction to said information support,
 a sequencer modulator coupled to said information receiving means and having an input for receiving said clock signal from said power oscillator,
 a carrier wave programmable oscillator for establishing a programming frequency carrier wave,
 a first static switch coupled to said modulator and to said carrier wave programmable oscillator,
 a power amplifier coupled to an output of said static switch,
 sequencer information output induction means, coupled to an output of said amplifier, for transmitting information to said information support by induction,
 sequencer information input induction means for receiving information from said information support by induction,
 signal shaping means, coupled to said information input induction means for shaping signals therefrom,
 a sequencer demodulator, coupled to said signal shaping means and having an input receiving said clock signal from said power oscillator,
 a register coupled to an output of said demodulator for storing information therefrom, and
 a comparator having a first input coupled to said register and a second input coupled to said information receiving means for comparing informations therefrom and providing a first output indicating an equality of information therebetween and a second output indicating an inequality of information therebetween, thereby checking to determine whether information stored on said information support by induction corresponds to information read from said information support by induction;

a movable information support including
information support information receiving induction means for receiving information from said sequence information output induction means,
demodulator coupled to said information support infromation receiving induction means,
an information support memory, coupled to said demodulator, for storing information therefrom,
an information support modulator, coupled to an output of said information support memory for modulating information read therefrom,
a second static switch coupled to an output of said information support modulator,
a series resonant circuit coupled to an output of said second static switch, and
information support output induction means, coupled to said series resonant circuit, for transmitting information by induction to a reading unit,
input power induction means for receiving power from said power output induction means of said reading unit or from said power induction trnasmitting means of said sequencer and,
power supply means coupled to said input power induction means for providing power to said demodulator, memory, and modulator, a reading unit including
reading unit induction receiving means for receiving information from said information support output induction means,
an information oscillator coupled to said reading unit induction receiving means,
a shaping circuit coupled to an output of said information oscillator,
a reading unit demodulator, coupled to an output of said shaping circuit,
temporary erasable memory means, coupled to an output of said reading unit demodulator,
an output interface for transferring information from said erasable memory to an external device,
a power oscillator for generating power, and
power output induction means, coupled to said power oscillator, for transferring energy by electromagnetic induction to said input power induction means of said information support.

2. A system according to claim 1 wherein said information support memory comprises a battery backed up memory element.

3. An arrangement according to claim 1 wherein said information support memory comprises an MOS technology EAROM memory.

4. A system according to claim 1, 2 or 3, wherein the modulation carried out by the modulators is pulse-width modulation with insertion of timing and parity information.

5. A system according to claim 1, 2 or 3 wherein the exchange of information between the information support and the sequencer is simultaneous.

6. A system according to claim 1, 2 or 3, wherein the exchange of information between the information support and the reading unit is permanent as long as they are opposite each other and, when they are no longer opposite each other, the last correct information received by the reading unit remains in the temporary memory of the reading unit.

7. A system as claimed in claim 1 wherein the reading unit comprises an information programming part similar to that of the sequencer and, comprising for each piece of information means for transmitting data and corresponding addresses, and a reading part restoring the data and their addresses on a read-request order, these two parts receiving the same clock signal and being able to operate simultaneously.

8. A system according to claim 4 wherein the exchange of information between the information support and the sequencer is simultaneous.

9. A system according to claim 4, wherein the exchange of information between the information support and the reading unit is permanent as long as they are inductively coupled to each other, the last correct information received by the reading unit remains in the temporary memory of the reading unit.

10. A system according to claim 5, wherein the exchange of information between the information support and the reading unit is permanent as long as they are inductively coupled to each other and, when they are no longer opposite each other, the last correct information received by the reading unit remains in the temporary memory of the reading unit.

11. A system according to claim 8, wherein the exchange of information between the information support and the reading hub is permement as long as they are inductively coupled to each other and, when they are no longer inductively coupled to each other, the last correct information received by the reading unit remains in the temporary memory of the reading unit.

* * * * *